(12) United States Patent
Cox et al.

(10) Patent No.: US 7,688,074 B2
(45) Date of Patent: Mar. 30, 2010

(54) ENERGY MANAGEMENT SYSTEM FOR AUTOMOTIVE VEHICLE

(75) Inventors: Michael Cox, Chicago, IL (US); Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 407 days.

(21) Appl. No.: 10/867,385

(22) Filed: Jun. 14, 2004

(65) Prior Publication Data

US 2005/0024061 A1 Feb. 3, 2005

Related U.S. Application Data

(60) Continuation-in-part of application No. 10/200,041, filed on Jul. 19, 2002, now Pat. No. 7,126,341, which is a continuation-in-part of application No. 10/046,659, filed on Oct. 29, 2001, now Pat. No. 6,909,287, which is a division of application No. 09/564,740, filed on May 4, 2000, now Pat. No. 6,331,762, which is a continuation-in-part of application No. 08/962,754, filed on Nov. 3, 1997, now Pat. No. 6,081,098, said application No. 10/200,041 is a continuation-in-part of application No. 09/816,768, filed on Mar. 23, 2001, now Pat. No. 6,586,941, said application No. 10/046, 659 is a continuation-in-part of application No. 09/575,627, filed on May 22, 2000, now Pat. No. 6,313,608, which is a continuation-in-part of application No. 08/962,754, filed on Nov. 3, 1997, now Pat. No. 6,081,098, application No. 10/867,385, which is a continuation-in-part of application No. 10/388,855, filed on Mar. 14, 2003, now Pat. No. 6,930,485, and a continuation-in-part of application No. 10/263,473, filed on Oct. 2, 2002, now abandoned, and a continuation-in-part of application No. 10/093,853, filed on Mar. 7, 2002, now Pat. No. 6,871,151, which is a continuation-in-part of application No. 10/046,659, which is a division of application No. 09/564,740, which is a continuation-in-part of application No. 08/962,754.

(60) Provisional application No. 60/132,622, filed on May 5, 1999, provisional application No. 60/165,208, filed on Nov. 12, 1999, provisional application No. 60/175,762, filed on Jan. 12, 2000, provisional application No. 60/192,222, filed on Mar. 27, 2000, provisional application No. 60/364,656, filed on Mar. 14, 2002, provisional application No. 60/330,441, filed on Oct. 17, 2001.

(51) Int. Cl.
*G01N 27/416* (2006.01)

(52) U.S. Cl. .................. 324/426; 324/427; 324/503; 320/104

(58) Field of Classification Search ............... 320/104; 307/9.1; 324/426, 427, 503
See application file for complete search history.

(56) References Cited

U.S. PATENT DOCUMENTS 2,000,665 A 5/1935 Neal .................... 439/440

(Continued)

FOREIGN PATENT DOCUMENTS

DE 29 26 716 B1 1/1981

(Continued)

OTHER PUBLICATIONS

"Results of Discrete Frequency Immittance Spectroscopy (DFIS) Measurements of Lead Acid Batteries", by K.S. Champlin et al., *Proceedings of 23rd International Teleco Conference* (INTELEC), published Oct. 2001, IEE, pp. 433-440.

(Continued)

*Primary Examiner*—Edward Tso
*Assistant Examiner*—Samuel Berhanu
(74) *Attorney, Agent, or Firm*—Westman, Champlin & Kelly, P.A.

(57) ABSTRACT

A battery monitor is provided for use with a battery of an automotive vehicle. The battery monitor can provide real time battery condition measurements and can selectively control the charging of the battery through an alternator of the vehicle based upon the measured battery condition.

42 Claims, 7 Drawing Sheets

U.S. PATENT DOCUMENTS

| | | | |
|---|---|---|---|
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,178,686 A | 4/1965 | Mills | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 20/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyawaka et al. | 324/426 |
| 3,889,248 A | 6/1975 | Ritter | 340/636 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 320/150 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 324/503 |
| 4,217,645 A | 8/1980 | Barry et al. | 702/63 |
| 4,280,457 A | 7/1981 | Bloxham | 123/198 |
| 4,297,639 A | 10/1981 | Branham | 324/429 |
| 4,315,204 A | 2/1982 | Sievers et al. | 322/28 |
| 4,316,185 A | 2/1982 | Watrous et al. | 320/116 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/772 |
| 4,514,694 A | 4/1985 | Finger | 324/429 |
| 4,520,353 A | 5/1985 | McAuliffe | 340/636 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 364/424.03 |
| 4,929,931 A | 5/1990 | McCuen | 340/636 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,032,825 A | 7/1991 | Xuznicki | 340/636 |
| 5,034,893 A | 7/1991 | Fisher | 701/99 |
| 5,037,778 A | 8/1991 | Stark et al. | 437/216 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |

| Patent | Date | Inventor | Class |
|---|---|---|---|
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 320/136 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 364/483 |
| 5,323,337 A | 6/1994 | Wilson et al. | 364/574 |
| 5,325,041 A | 6/1994 | Briggs | 320/149 |
| 5,331,268 A | 7/1994 | Patino et al. | 320/158 |
| 5,332,927 A | 7/1994 | Paul | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 320/136 |
| 5,369,364 A | 11/1994 | Renirie et al. | 324/430 |
| 5,381,096 A | 1/1995 | Hirzel | 324/427 |
| 5,387,871 A | 2/1995 | Tsai | 324/429 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/160 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 320/DIG. 21 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koench | 320/138 |
| 5,519,383 A | 5/1996 | De La Rosa | 340/636 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/152 |
| 5,650,937 A | 7/1997 | Bounaga | 702/6 |
| 5,652,501 A | 7/1997 | McClure et al. | 320/118 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 320/161 |
| 5,661,368 A | 8/1997 | Deol et al. | 315/82 |
| 5,675,234 A | 10/1997 | Greene | 320/DIG. 18 |
| 5,677,077 A | 10/1997 | Faulk | 429/90 |
| 5,684,678 A | 11/1997 | Barrett | 363/17 |
| 5,699,050 A | 12/1997 | Kanazawa | 340/636 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 320/128 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |

| Patent Number | Kind | Date | Inventor(s) | Class/Subclass |
|---|---|---|---|---|
| 5,914,605 | A | 6/1999 | Bertness | 324/430 |
| 5,927,938 | A | 7/1999 | Hammerslag | 414/809 |
| 5,929,609 | A | 7/1999 | Joy et al. | 322/25 |
| 5,939,855 | A | 8/1999 | Proctor et al. | 320/104 |
| 5,939,861 | A | 8/1999 | Joko et al. | 320/122 |
| 5,945,829 | A | 8/1999 | Bertness | 324/430 |
| 5,946,605 | A | 8/1999 | Takahisa et al. | 455/68 |
| 5,951,229 | A | 9/1999 | Hammerslag | 414/398 |
| 5,961,561 | A | 10/1999 | Wakefield, II | 701/29 |
| 5,961,604 | A | 10/1999 | Anderson et al. | 709/229 |
| 5,969,625 | A | 10/1999 | Russo | 340/636.19 |
| 5,978,805 | A | 11/1999 | Carson | 707/10 |
| 5,982,138 | A | 11/1999 | Krieger | 320/105 |
| 6,002,238 | A | 12/1999 | Champlin | 320/134 |
| 6,005,759 | A | 12/1999 | Hart et al. | 361/66 |
| 6,008,652 | A | 12/1999 | Theofanopoulos et al. | 324/434 |
| 6,009,369 | A | 12/1999 | Boisvert et al. | 701/99 |
| 6,016,047 | A | 1/2000 | Notten et al. | 320/137 |
| 6,031,354 | A | 2/2000 | Wiley et al. | 320/116 |
| 6,031,368 | A | 2/2000 | Klippel et al. | 324/133 |
| 6,037,745 | A | 3/2000 | Koike et al. | 320/104 |
| 6,037,749 | A | 3/2000 | Parsonage | 320/132 |
| 6,037,751 | A | 3/2000 | Klang | 320/160 |
| 6,037,777 | A | 3/2000 | Champlin | 324/430 |
| 6,037,778 | A * | 3/2000 | Makhija | 324/433 |
| 6,046,514 | A | 4/2000 | Rouillard et al. | 307/77 |
| 6,051,976 | A | 4/2000 | Bertness | 324/426 |
| 6,055,468 | A | 4/2000 | Kaman et al. | 701/29 |
| 6,061,638 | A | 5/2000 | Joyce | 702/63 |
| 6,064,372 | A | 5/2000 | Kahkoska | 345/173 |
| 6,072,299 | A | 6/2000 | Kurie et al. | 320/112 |
| 6,072,300 | A | 6/2000 | Tsuji | 320/116 |
| 6,081,098 | A | 6/2000 | Bertness et al. | 320/134 |
| 6,081,109 | A | 6/2000 | Seymour et al. | 324/127 |
| 6,087,815 | A * | 7/2000 | Pfeifer et al. | 323/282 |
| 6,091,238 | A | 7/2000 | McDermott | 324/207.2 |
| 6,091,245 | A * | 7/2000 | Bertness | 324/426 |
| 6,094,033 | A | 7/2000 | Ding et al. | 320/132 |
| 6,100,670 | A | 8/2000 | Levesque | 320/150 |
| 6,104,167 | A | 8/2000 | Bertness et al. | 320/132 |
| 6,113,262 | A * | 9/2000 | Purola et al. | 374/45 |
| 6,114,834 | A | 9/2000 | Parise | 320/109 |
| 6,137,269 | A | 10/2000 | Champlin | 320/150 |
| 6,140,797 | A | 10/2000 | Dunn | 320/105 |
| 6,144,185 | A | 11/2000 | Dougherty et al. | 320/132 |
| 6,150,793 | A | 11/2000 | Lesesky et al. | 320/104 |
| 6,158,000 | A | 12/2000 | Collins | 713/1 |
| 6,161,640 | A | 12/2000 | Yamaguchi | 180/65.8 |
| 6,163,156 | A | 12/2000 | Bertness | 324/426 |
| 6,164,063 | A | 12/2000 | Mendler | 60/274 |
| 6,167,349 | A | 12/2000 | Alvarez | 702/63 |
| 6,172,483 | B1 | 1/2001 | Champlin | 320/134 |
| 6,172,505 | B1 | 1/2001 | Bertness | 324/430 |
| 6,177,737 | B1 | 1/2001 | Palfey et al. | 307/64 |
| 6,181,545 | B1 | 1/2001 | Amatucci et al. | 361/502 |
| 6,211,651 | B1 | 4/2001 | Nemoto | 320/133 |
| 6,215,275 | B1 | 4/2001 | Bean | 320/106 |
| 6,218,936 | B1 | 4/2001 | Imao | 340/447 |
| 6,222,342 | B1 | 4/2001 | Eggert et al. | 320/105 |
| 6,222,369 | B1 | 4/2001 | Champlin | 324/430 |
| D442,503 | S | 5/2001 | Lundbeck et al. | D10/77 |
| 6,225,808 | B1 | 5/2001 | Varghese et al. | 324/426 |
| 6,236,332 | B1 | 5/2001 | Conkright et al. | 340/3.1 |
| 6,238,253 | B1 | 5/2001 | Qualls | 439/759 |
| 6,242,887 | B1 | 6/2001 | Burke | 320/104 |
| 6,249,124 | B1 | 6/2001 | Bertness | 324/426 |
| 6,250,973 | B1 | 6/2001 | Lowery et al. | 439/763 |
| 6,254,438 | B1 | 7/2001 | Gaunt | 439/755 |
| 6,259,170 | B1 | 7/2001 | Limoge et al. | 307/10.8 |
| 6,259,254 | B1 | 7/2001 | Klang | 324/427 |
| 6,262,563 | B1 | 7/2001 | Champlin | 320/134 |
| 6,263,268 | B1 | 7/2001 | Nathanson | 701/29 |
| 6,271,643 | B1 | 8/2001 | Becker et al. | 320/112 |
| 6,271,748 | B1 | 8/2001 | Derbyshire et al. | 340/442 |
| 6,275,008 | B1 | 8/2001 | Arai et al. | 320/132 |
| 6,294,896 | B1 | 9/2001 | Champlin | 320/134 |
| 6,294,897 | B1 | 9/2001 | Champlin | 320/153 |
| 6,304,087 | B1 | 10/2001 | Bertness | 324/426 |
| 6,307,349 | B1 | 10/2001 | Koenck et al. | 320/112 |
| 6,310,481 | B2 | 10/2001 | Bertess | 324/430 |
| 6,313,607 | B1 | 11/2001 | Champlin | 320/132 |
| 6,313,608 | B1 | 11/2001 | Varghese et al. | 32/132 |
| 6,316,914 | B1 | 11/2001 | Bertness | 320/134 |
| 6,320,351 | B1 | 11/2001 | Ng et al. | 320/104 |
| 6,323,650 | B1 | 11/2001 | Bertness et al. | 324/426 |
| 6,329,793 | B1 | 12/2001 | Bertness et al. | 320/132 |
| 6,331,762 | B1 | 12/2001 | Bertness | 320/134 |
| 6,332,113 | B1 | 12/2001 | Bertness | 702/63 |
| 6,346,795 | B2 | 2/2002 | Haraguchi et al. | 320/136 |
| 6,347,958 | B1 | 2/2002 | Tsai | 439/488 |
| 6,351,102 | B1 | 2/2002 | Troy | 320/139 |
| 6,356,042 | B1 | 3/2002 | Kahlon et al. | 318/138 |
| 6,359,441 | B1 | 3/2002 | Bertness | 324/426 |
| 6,359,442 | B1 | 3/2002 | Henningson et al. | 324/426 |
| 6,363,303 | B1 | 3/2002 | Bertness | 701/29 |
| RE37,677 | E | 4/2002 | Irie | 315/83 |
| 6,377,031 | B1 | 4/2002 | Karuppana et al. | 323/220 |
| 6,384,608 | B1 | 5/2002 | Namaky | 324/430 |
| 6,388,448 | B1 | 5/2002 | Cervas | 324/426 |
| 6,392,414 | B2 | 5/2002 | Bertness | 324/429 |
| 6,396,278 | B1 | 5/2002 | Makhija | 324/402 |
| 6,407,554 | B1 * | 6/2002 | Godau et al. | 324/503 |
| 6,411,098 | B1 | 6/2002 | Laletin | 324/436 |
| 6,417,669 | B1 | 7/2002 | Champlin | 324/426 |
| 6,420,852 | B1 | 7/2002 | Sato | 320/134 |
| 6,424,157 | B1 | 7/2002 | Gollomp et al. | 324/430 |
| 6,424,158 | B2 | 7/2002 | Klang | 324/433 |
| 6,437,957 | B1 | 8/2002 | Karuppana et al. | 361/78 |
| 6,441,585 | B1 | 8/2002 | Bertness | 320/132 |
| 6,445,158 | B1 | 9/2002 | Bertness et al. | 320/104 |
| 6,449,726 | B1 | 9/2002 | Smith | 713/340 |
| 6,456,036 | B1 | 9/2002 | Thandiwe | 320/106 |
| 6,456,045 | B1 | 9/2002 | Troy et al. | 320/139 |
| 6,465,908 | B1 | 10/2002 | Karuppana et al. | 307/31 |
| 6,466,025 | B1 | 10/2002 | Klang | 324/429 |
| 6,466,026 | B1 | 10/2002 | Champlin | 324/430 |
| 6,469,511 | B1 | 10/2002 | Vonderhaar et al. | 324/425 |
| 6,477,478 | B1 * | 11/2002 | Jones et al. | 702/102 |
| 6,495,990 | B2 | 12/2002 | Champlin | 320/132 |
| 6,497,209 | B1 | 12/2002 | Karuppana et al. | 123/179.3 |
| 6,500,025 | B1 | 12/2002 | Moenkhaus et al. | 439/502 |
| 6,505,507 | B1 | 1/2003 | Imao | 73/146.5 |
| 6,507,196 | B2 | 1/2003 | Thomsen et al. | 324/436 |
| 6,526,361 | B1 | 2/2003 | Jones et al. | 702/63 |
| 6,529,723 | B1 | 3/2003 | Bentley | 455/405 |
| 6,531,848 | B1 | 3/2003 | Chitsazan et al. | 320/153 |
| 6,532,425 | B1 * | 3/2003 | Boost et al. | 702/63 |
| 6,534,993 | B2 | 3/2003 | Bertness | 324/433 |
| 6,544,078 | B2 | 4/2003 | Palmisano et al. | 439/762 |
| 6,545,599 | B2 | 4/2003 | Derbyshire et al. | 340/442 |
| 6,556,019 | B2 | 4/2003 | Bertness | 324/426 |
| 6,566,883 | B1 | 5/2003 | Vonderhaar et al. | 324/426 |
| 6,570,385 | B1 | 5/2003 | Roberts et al. | 324/378 |
| 6,586,941 | B2 | 7/2003 | Bertness et al. | 324/426 |
| 6,597,150 | B1 | 7/2003 | Bertness et al. | 320/104 |
| 6,599,243 | B2 * | 7/2003 | Woltermann et al. | 600/300 |
| 6,600,815 | B1 | 7/2003 | Walding | 379/93.07 |
| 6,611,740 | B2 | 8/2003 | Lowrey et al. | 701/29 |
| 6,618,644 | B2 | 9/2003 | Bean | 700/231 |
| 6,621,272 | B2 | 9/2003 | Champlin | 324/426 |
| 6,623,314 | B1 | 9/2003 | Cox et al. | 439/759 |
| 6,624,635 | B1 | 9/2003 | Lui | 324/426 |
| 6,628,011 | B2 | 9/2003 | Droppo et al. | 307/43 |
| 6,629,054 | B2 | 9/2003 | Makhija et al. | 702/113 |
| 6,633,165 | B2 | 10/2003 | Bertness | 324/426 |
| 6,635,974 | B1 | 10/2003 | Karuppana et al. | 307/140 |

| | | | | | | |
|---|---|---|---|---|---|---|
| 6,667,624 | B1 | 12/2003 | Raichle et al. ............... 324/522 | 2004/0002825 A1 | 1/2004 | Raichle et al. ................ 702/63 |
| 6,679,212 | B2 | 1/2004 | Kelling .................. 123/179.28 | 2004/0002836 A1 | 1/2004 | Raichle et al. .............. 702/188 |
| 6,686,542 | B2 | 2/2004 | Zhang ........................ 174/74 | 2004/0032264 A1* | 2/2004 | Schoch ...................... 324/426 |
| 6,696,819 | B2 | 2/2004 | Bertness ..................... 320/134 | 2004/0044452 A1 | 3/2004 | Bauer et al. .................. 703/33 |
| 6,707,303 | B2 | 3/2004 | Bertness et al. ............. 324/426 | 2004/0049361 A1 | 3/2004 | Hamdan et al. ............. 702/115 |
| 6,736,941 | B2 | 5/2004 | Oku et al. ..................... 203/68 | 2004/0051533 A1 | 3/2004 | Namaky ..................... 324/426 |
| 6,737,831 | B2 | 5/2004 | Champlin ................... 320/132 | 2004/0054503 A1 | 3/2004 | Namaky ..................... 702/183 |
| 6,738,697 | B2 | 5/2004 | Breed ........................... 701/29 | 2004/0113588 A1 | 6/2004 | Mikuriya et al. ............ 320/128 |
| 6,740,990 | B2* | 5/2004 | Tozuka et al. ................ 307/9.1 | 2004/0145342 A1 | 7/2004 | Lyon .......................... 320/108 |
| 6,744,149 | B1 | 6/2004 | Karuppana et al. ............ 307/31 | 2004/0178185 A1 | 9/2004 | Yoshikawa et al. .......... 219/270 |
| 6,745,153 | B2 | 6/2004 | White et al. ................. 702/184 | 2004/0227523 A1 | 11/2004 | Namaky ..................... 324/537 |
| 6,759,849 | B2 | 7/2004 | Bertness ..................... 324/426 | 2004/0239332 A1 | 12/2004 | Mackel et al. ............... 324/426 |
| 6,777,945 | B2 | 8/2004 | Roberts et al. .............. 324/426 | 2005/0017726 A1 | 1/2005 | Koran et al. ................. 324/433 |
| 6,781,382 | B2 | 8/2004 | Johnson ...................... 324/426 | 2005/0043868 A1 | 2/2005 | Mitcham ...................... 701/29 |
| 6,784,635 | B2* | 8/2004 | Larson ........................ 320/104 | 2005/0102073 A1 | 5/2005 | Ingram ......................... 701/29 |
| 6,788,025 | B2 | 9/2004 | Bertness et al. ............. 320/104 | 2005/0182536 A1 | 8/2005 | Doyle et al. ................... 701/29 |
| 6,795,782 | B2 | 9/2004 | Bertness et al. ............... 702/63 | 2005/0254106 A9 | 11/2005 | Silverbrook et al. ......... 358/539 |
| 6,796,841 | B1 | 9/2004 | Cheng et al. .............. 439/620.3 | 2005/0256617 A1 | 11/2005 | Cawthorne et al. ............ 701/22 |
| 6,805,090 | B2 | 10/2004 | Bertness et al. ............... 123/198 | 2006/0030980 A1 | 2/2006 | St. Denis ...................... 701/29 |
| 6,806,716 | B2 | 10/2004 | Bertness et al. .............. 324/426 | 2006/0089767 A1 | 4/2006 | Sowa .......................... 701/29 |
| 6,850,037 | B2 | 2/2005 | Bertness ..................... 320/132 | 2006/0217914 A1 | 9/2006 | Bertness ..................... 702/113 |
| 6,871,151 | B2 | 3/2005 | Bertness ....................... 702/63 | | | |
| 6,885,195 | B2 | 4/2005 | Bertness ..................... 324/426 | FOREIGN PATENT DOCUMENTS | | |
| 6,888,468 | B2 | 5/2005 | Bertness ................ 340/636.15 | DE | 19638324 | 9/1996 |
| 6,891,378 | B2 | 5/2005 | Bertness et al. ............. 324/426 | EP | 0 022 450 A1 | 1/1981 |
| 6,904,796 | B2 | 6/2005 | Pacsai et al. ................ 73/146.8 | EP | 0 637 754 A1 | 2/1995 |
| 6,906,522 | B2* | 6/2005 | Bertness et al. ............. 324/426 | EP | 0 772 056 A1 | 5/1997 |
| 6,906,523 | B2 | 6/2005 | Bertness et al. ............. 324/426 | EP | 0 982 159 A2 | 3/2000 |
| 6,906,624 | B2 | 6/2005 | McClelland et al. ........ 340/442 | FR | 2 749 397 | 12/1997 |
| 6,909,287 | B2* | 6/2005 | Bertness ..................... 324/427 | GB | 2 029 586 | 3/1980 |
| 6,913,483 | B2 | 7/2005 | Restaino et al. ............. 439/504 | GB | 2 088 159 A | 6/1982 |
| 6,914,413 | B2 | 7/2005 | Bertness et al. ............. 320/104 | GB | 2 246 916 A | 10/1990 |
| 6,919,725 | B2 | 7/2005 | Bertness et al. ............. 324/433 | GB | 2 275 783 A | 7/1994 |
| 6,930,485 | B2 | 8/2005 | Bertness et al. ............. 324/426 | GB | 2 387 235 A | 10/2003 |
| 6,933,727 | B2 | 8/2005 | Bertness et al. ............. 324/426 | JP | 59-17892 | 1/1984 |
| 6,941,234 | B2 | 9/2005 | Bertness et al. ............... 702/63 | JP | 59-17893 | 1/1984 |
| 6,967,484 | B2 | 11/2005 | Bertness ..................... 324/426 | JP | 59-17894 | 1/1984 |
| 6,998,847 | B2 | 2/2006 | Bertness et al. ............. 324/426 | JP | 59017894 | 1/1984 |
| 7,003,410 | B2 | 2/2006 | Bertness et al. ............... 702/63 | JP | 59215674 | 12/1984 |
| 7,003,411 | B2 | 2/2006 | Bertness ....................... 702/63 | JP | 60225078 | 11/1985 |
| 7,012,433 | B2 | 3/2006 | Smith et al. ................. 324/426 | JP | 62-180284 | 8/1987 |
| 7,058,525 | B2 | 6/2006 | Bertness et al. ............... 702/63 | JP | 63027776 | 2/1988 |
| 7,081,755 | B2 | 7/2006 | Klang et al. ................. 324/426 | JP | 03274479 | 12/1991 |
| 7,106,070 | B2 | 9/2006 | Bertness et al. ............. 324/538 | JP | 03282276 | 12/1991 |
| 7,116,109 | B2 | 10/2006 | Klang ......................... 324/426 | JP | 4-8636 | 1/1992 |
| 7,119,686 | B2 | 10/2006 | Bertness et al. .......... 340/572.1 | JP | 04095788 | 3/1992 |
| 7,126,341 | B2 | 10/2006 | Bertness et al. ............. 324/426 | JP | 04131779 | 5/1992 |
| 7,129,706 | B2 | 10/2006 | Kalley ........................ 324/426 | JP | 04372536 | 12/1992 |
| 7,272,519 | B2 | 9/2007 | Lesesky et al. ................ 702/63 | JP | 05211724 A | 8/1993 |
| 2002/0004694 | A1 | 1/2002 | McLeod ....................... 701/29 | JP | 5216550 | 8/1993 |
| 2002/0010558 | A1 | 1/2002 | Bertness et al. ............... 702/63 | JP | 7-128414 | 5/1995 |
| 2002/0030495 | A1 | 3/2002 | Kechmire ................... 324/427 | JP | 09061505 | 3/1997 |
| 2002/0041175 | A1 | 4/2002 | Lauper et al. ............... 320/106 | JP | 10056744 | 2/1998 |
| 2002/0044050 | A1 | 4/2002 | Derbyshire et al. ......... 340/442 | JP | 10232273 | 9/1998 |
| 2002/0050163 | A1 | 5/2002 | Makhija et al. ............... 73/116 | JP | 11103503 A | 4/1999 |
| 2002/0171428 | A1 | 11/2002 | Bertness ..................... 324/426 | RU | 2089015 C1 | 8/1997 |
| 2002/0176010 | A1 | 11/2002 | Wallach et al. .............. 348/362 | WO | WO 93/22666 | 11/1993 |
| 2003/0009270 | A1 | 1/2003 | Breed ........................... 701/29 | WO | WO 94/05069 | 3/1994 |
| 2003/0025481 | A1 | 2/2003 | Bertness ..................... 324/427 | WO | WO 96/01456 | 1/1996 |
| 2003/0036909 | A1 | 2/2003 | Kato .......................... 704/275 | WO | WO 96/06747 | 3/1996 |
| 2003/0088375 | A1 | 5/2003 | Bertness et al. ............... 702/63 | WO | WO 97/44652 | 11/1997 |
| 2003/0169018 | A1* | 9/2003 | Berels et al. ................. 320/132 | WO | WO 98/04910 | 2/1998 |
| 2003/0184262 | A1 | 10/2003 | Makhija ..................... 320/130 | WO | WO 98/58270 | 12/1998 |
| 2003/0184306 | A1* | 10/2003 | Bertness et al. ............. 324/426 | WO | WO 99/23738 | 5/1999 |
| 2003/0187556 | A1 | 10/2003 | Suzuki ......................... 701/29 | WO | WO 00/16083 | 3/2000 |
| 2003/0194672 | A1 | 10/2003 | Roberts et al. .............. 431/196 | WO | WO 00/16614 A1 | 3/2000 |
| 2003/0214395 | A1 | 11/2003 | Flowerday et al. .......... 340/445 | WO | WO 00/16615 A1 | 3/2000 |
| 2004/0000590 | A1 | 1/2004 | Raichle et al. ........ 235/462.01 | WO | WO 00/62049 | 10/2000 |
| 2004/0000891 | A1 | 1/2004 | Raichle et al. ............. 320/107 | WO | WO 00/67359 | 11/2000 |
| 2004/0000893 | A1 | 1/2004 | Raichle et al. ............. 320/135 | WO | WO 01/59443 | 2/2001 |
| 2004/0000913 | A1 | 1/2004 | Raichle et al. ............. 324/426 | WO | WO 01/16614 | 3/2001 |
| 2004/0000915 | A1 | 1/2004 | Raichle et al. ............. 324/522 | WO | WO 01/16615 | 3/2001 |
| 2004/0002824 | A1 | 1/2004 | Raichle et al. ............... 702/63 | | | |

| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Examination Report" from the U.K. Patent Office for U.K. App. No. 0417678.0.

"Dynamic modelling of lead/acid batteries using impedance spectroscopy for parameter identification", Journal of Power Sources, pp. 69-84, (1997).

"A review of impedance measurements for determination of the state-of-charge or state-of-health of secondary batteries", Journal of Power Sources, pp. 59-69, (1998).

"Improved Impedance Spectroscopy Technique for Status Determination of Production Li/SO$_2$ Batteries" Terrill Atwater et al., pp. 10-113, (1992).

"Search Report Under Section 17" for Great Britain Application No. GB0421447.4. (Jan. 28, 2005).

"Notification of Transmittal of the International Search Report or the Declaration", PCT/US02/29461.

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"Battery Impedance", by E. Wilihnganz et al., *Electrical Engineering*, Sep. 1959, pp. 922-925.

"JIS Japanese Industrial Standard-Lead Acid Batteries for Automobiles", *Japanese Standards Association UDC*, 621. 355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design a 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use Single Battery", *Electronix Express*, downloaded from http://www.elexp.com/t_dc-dc.htm, undated.

"Notification of Transmittal of the International Search Report or the Declaration", PCT/US02/29461.

"Notification of Transmittal of the International Search Report or the Declaration", PCT/US03/07546.

"Notification of Transmittal of the International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

"DC-DC Converter Basics", *Power Designers*, downloaded from http://www.powederdesigners.com/InforWeb.design_center/articles/DC-DC/converter.shtm, undated.

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the U.K. Patent Office for U.K. App. No. 0417678.0.

Wikipedia Online Encyclopedia, INDUCTANCE, 2005, http://en.wikipedia.org/wiki/inductance, pp. 1-5, mutual Inductance, pp. 3,4.

Young Illustrated Encyclopedia Dictionary of Electronics, 1981, Parker Publishing Company, Inc., pp. 318-319.

"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.

"DSP Applications in Hybrid Electric Vehicle Powertrain", Miller et al., Proceedings of the American Control Conference, Sand Diego, CA, Jun. 1999; 2 ppg.

"Notification of Transmittal of the International Search Report and the Written Opinion of the International Searching Authority, or the Declaration" for PCT/US2008/008702 filed Jul. 2008; 15 pages.

* cited by examiner

ENERGY MANAGEMENT SYSTEM FOR AUTOMOTIVE VEHICLE

BACKGROUND OF THE INVENTION

The present application is a Continuation-in-Part of application Ser. No. 10/200,041, filed Jul. 19, 2002 now U.S. Pat. No. 7,126,341 which is a Continuation-in-Part of application Ser. No. 10/046,659, filed Oct. 29, 2001 which now U.S. Pat. No. 6,909,287 is a divisional of application Ser. No. 09/564,740, filed May 4, 2000, now U.S. Pat. No. 6,331,762, which in turn claims priority to Provisional Application Ser. No. 60/132,622, filed May 5, 1999, U.S. Provisional Application No. 60/165,208, filed Nov. 12, 1999, and Provisional Application Ser. No. 60/175,762, filed Jan. 12, 2000, which is a Continuation-In-Part of Ser. No. 08/962,754, filed Nov. 3, 1997, now U.S. Pat. No. 6,081,098, application Ser. No. 10/200,041 is also a Continuation-In-Part of application Ser. No. 09/816,768," filed Mar. 23, 2001, now U.S. Pat. No. 6,586,941 which in turn claims priority to U.S. Provisional Application Ser. No. 60/192,222, filed Mar. 27, 2000, application Ser. No. 10/046,659, filed Oct. 29, 2001 is also a Continuation-In-Part of application Ser. No. 09/575,627, filed May 22, 2000, now U.S. Pat. No. 6,313,608, which is a Continuation-in-Part of application Ser. No. 08/962,754, filed Nov. 3, 1997, now U.S. Pat. No. 6,081,098. This application is also a Continuation-In-Part of U.S. Ser. No. 10/388,855, filed Mar. 14, 2003, now U.S. Pat. No. 6,930,485 which claims priority to provisional Ser. No. 60/364,656, filed Mar. 14, 2002, the present application is also a Continuation-In-part of U.S. Ser. No. 10/263,473, filed Oct. 2, 2002, now abandoned which claims priority to provisional Ser. No. 60/330,441, filed Oct. 17, 2001, and the present application is also a Continuation-In-Part of U.S. Ser. No. 10/093,853, filed Mar. 7, 2002, now U.S. Pat. No. 6,871,151 which is a Continuation-in-Part of application Ser. No. 10/046,659, filed Oct. 29, 2001 which is a divisional of application Ser. No. 09/564,740, filed May 4, 2000, now U.S. Pat. No. 6,331,762, which in turn claims priority to Provisional Application Ser. No. 60/132,622, filed May 5, 1999, U.S. Provisional Application No. 60/165,208, filed Nov. 12, 1999, and Provisional Application Ser. No. 60/175,762, filed Jan. 12, 2000, which is a Continuation-In-Part of Ser. No. 08/962,754, filed Nov. 3, 1997, now U.S. Pat. No. 6,081,098, which are incorporated herein by reference in their entirety.

The present invention relates to automotive vehicles. More specifically, the present invention relates to an energy management and monitor system for a battery of an automotive vehicle.

Automotive vehicles powered by combustion engines typically include a battery. The battery is used to power the electrical system when the engine is not running. Additionally, the engine is used to charge the battery. The engine is also used to power electrical components of the vehicle when the engine is running.

Vehicles contain charging systems, simply referred to as an "alternator," which are powered by the engine and used to charge the battery. Typical prior art charging systems have been a simple voltage regulator connected to the output of an alternator. The voltage regulator is used to set a voltage generated by the alternator which is applied to the battery. However, this simple technique does not take into account the actual condition of the battery as the voltage across the battery is not an accurate representation of the battery's condition. Additionally, such systems do not provide any information about the use of the battery, or the battery's current state of charge or state of health.

SUMMARY OF THE INVENTION

Various aspects of the present invention provide a method and/or an apparatus for monitoring, testing or controlling charging of a battery or electrical in a vehicle. In one aspect, a predictive output is provided which provides an indication of performance of the electrical system in a new environment.

DETAILED DESCRIPTION OF THE ILLUSTRATIVE EMBODIMENTS

The present invention offers an apparatus and method for monitoring the condition of the battery and controlling charging of the battery. Such a method and apparatus can be part of a general energy management system for a vehicle.

Figure 1:
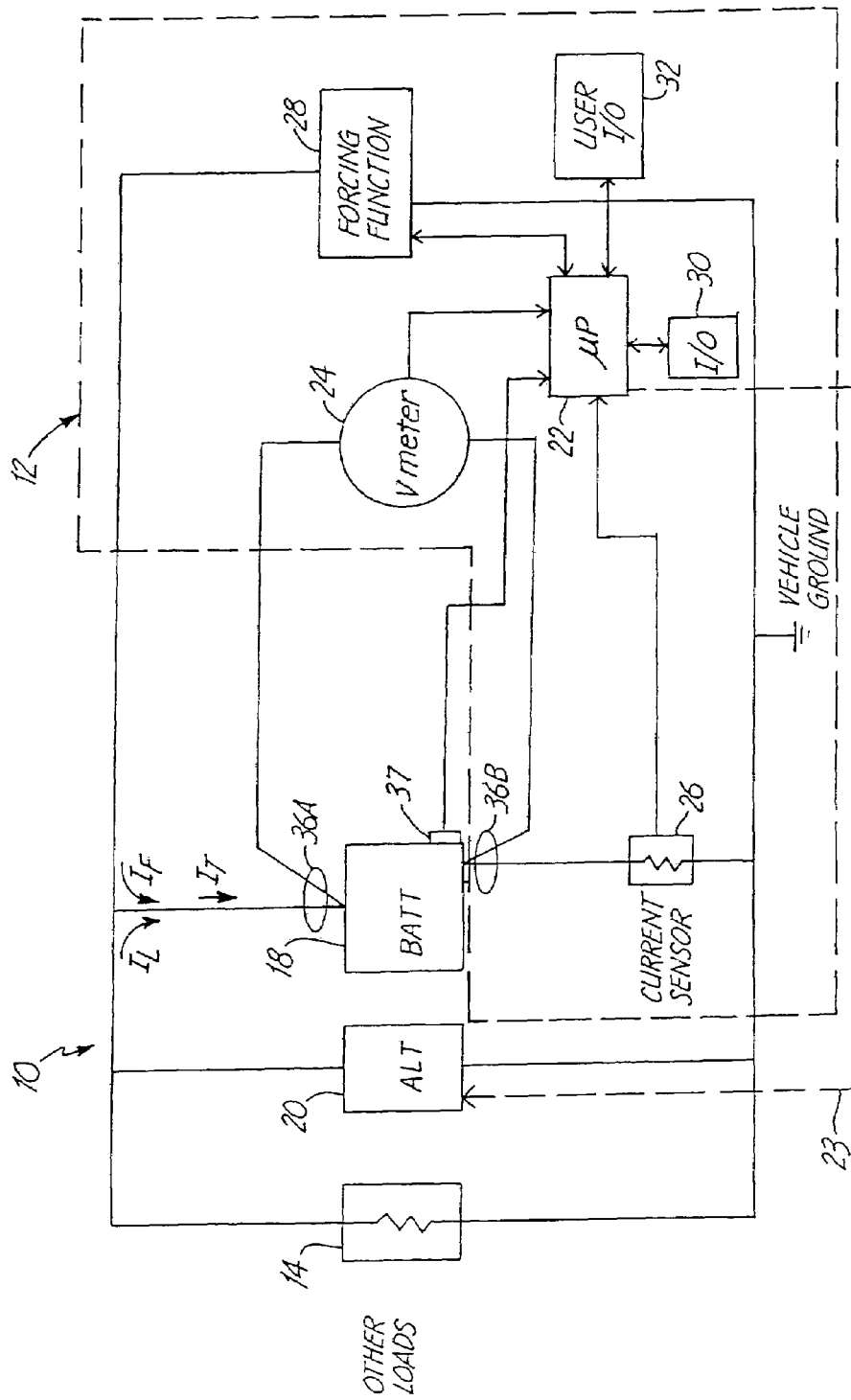
FIG. 1 is a simplified block diagram showing a battery monitor in a vehicle in accordance with one embodiment of the present invention.

FIG. 1 is a simplified block diagram showing an automotive vehicle 10 which includes a battery monitor 12 in accordance with one embodiment of the present invention. Vehicle 10 includes vehicle loads 14 which are shown schematically as an electrical resistance. A battery 18 is coupled to the vehicle load 14 and to an alternator 20. Alternator 20 couples to an engine of the vehicle 10 and is used to charge battery 18 and provide power to loads 14 during operation.

In general, automotive vehicles include electrical systems which can be powered when the engine of the vehicle is operating by a generator, or alternator. However, when the engine is not running, a battery in the vehicle is typically used to power the system. Thus, the standard generator system in a vehicle serves two purposes. The generator is used to supply power to the vehicle loads, such as lights, computers, radios, defrosters and other electrical accessories. Further, the generator is used to recharge the battery such that the battery can be used to start the vehicle and such that the battery may power the electrical accessories when the engine is not running.

A standard generator system typically consists of a three phase AC alternator coupled to the engine by a belt or a shaft, rectification diodes and a voltage regulator. These components may exist separately or be part of an integral unit and are typically, somewhat inaccurately, referred to as an "alternator". The voltage regulator is configured such that a constant voltage is supplied by the charging system, regardless of the current being drawn by the electrical system. The actual load applied to the generator system varies depending upon the number of accessories that are activated and the current required to recharge the battery. Typical values for the voltage regulator output are between 13.5 and 15.5 volts, depending upon the vehicle manufacturer and particular battery chemistry. Further, the voltage on a specific vehicle can also be compensated for ambient temperature.

This prior art approach has a number of draw backs. The output voltage of the generator must be selected to be high enough to rapidly charge the battery under any condition and regardless of the state of charge of the battery. Electrical loads on the vehicle are designed to operate at 12.6 volts, the voltage provided by the battery when the engine is switched off. However, these electrical loads must also operate at the higher voltage supplied when the generator system is on. This higher voltage which is impressed upon the electrical system causes higher $I^2R$ (resistive) losses in the loads due to the increased voltage level. This wastes energy and causes the components to heat. This results in reduced life of the electrical circuitry, higher operating temperatures and wasted energy which must ultimately come from the primary fuel source used to operate the engine.

The high voltage across the battery is necessary when the battery's state of charge is low in order to rapidly recharge the battery. However, when the battery's state of charge is within an acceptable range (which occurs most of the time at normal driving speeds), the high voltage across the battery results in high $I^2R$ (resistive heating) losses within the battery resulting in waste of energy, heating of the battery causing premature battery failure, gassing of the battery also resulting in premature failure and heating of electrical components causing premature component failure.

One aspect of the present invention includes the recognition of the aforementioned problems associated with prior art battery charging techniques. In one aspect of the present invention, a battery charging system controller is provided which monitors the condition of the battery under charge and controls the charging system in response to the condition of the battery. With such general aspects of the invention, the particular implementation of the battery monitor and charge control can be selected as appropriate.

In the embodiment illustrated in FIG. 1, battery monitor 12 includes a microprocessor 22 coupled to a voltage sensor 24, a current sensor 26 and a forcing function 28. Microprocessor 22 may also include one or more inputs and outputs illustrated as I/O 30 adapted to couple to an external databus or to an internal databus associated with the vehicle 10. Further, a user input/output (I/O) 32 is provided for providing interaction with a vehicle operator. In one embodiment, microprocessor 22 is coupled to alternator 20 to provide a control output 23 to alternator 20 in response to inputs, alone or in various functional combinations, from current sensor 26, voltage sensor 24 and forcing function 28. In one embodiment, the control output 23 is configured to control alternator 20 such that a nominal voltage output from alternator 20 is 12.6 volts, typical of the nominal open-circuit voltage of the battery 18. Further, microprocessor 22 can raise the output voltage from alternator 20 in accordance with an inverse relationship to the state of charge of battery 18. This can be configured such that alternator 20 only charges battery 18 when necessary, and only charges battery 18 as much as is necessary. This charging technique can increase battery life, lower component temperature of loads 14, increase the lifespan of loads 14 and save fuel. This configuration provides a feedback mechanism in which the state of charge of battery 18 is used to control the charging of battery 18. The battery monitor 12 is easily installed in a vehicle electrical system. A single shunt current sensor 26 must be inserted in one of the primary battery cables and a control line provided to allow control of alternator 20.

The control can be by simply adjusting the voltage supplied to a voltage regulator of alternator 20 to thereby control charging of battery 18. The battery monitor 12 can be a separate, self-sufficient and self-contained monitor which operates without requiring interaction with other components of the vehicle, except in some embodiment, alternator 20.

FIG. 1 also illustrates a Kelvin connection formed by connections 36A and 36B to battery 18. With such a Kelvin connection, two couplings are provided to the positive and negative terminals of battery 18. This allows one of the electrical connections on each side of the battery to carry large amounts of current while the other pair of connections can be used to obtain accurate voltage readings. Because substantially no current is flowing through the voltage sensor 24, there will be little voltage drop through the electrical connection between sensor 24 and battery 18 thereby providing more accurate voltage measurements. In various embodiments, the forcing function 28 can be located physically proximate battery 18 or be connected directly to battery 18. In other embodiments, the forcing function 28 is located anywhere within the electrical system of vehicle 10. In one aspect, the present invention includes an in-vehicle battery monitor 12 which couples to battery 18 through a Kelvin connection and further may optionally include a current sensor 26 and may be capable of monitoring battery condition while the engine of vehicle 12 is operated, loads 14 are turned on and/or alternator 20 is providing a charge signal output to charge battery 18. In one particular embodiment, the combination of the Kelvin connection formed by connections 36A and 36B along with a separate current sensor 26 connected in series with the electrical system of the vehicle 10 is provided and allows monitoring of the condition of battery 18 during operation of vehicle 10. The use of an current sensor 26 is used to provide a monitor of the total current $I_T$ flowing through battery 18.

In operation, microprocessor 22 is capable of measuring a dynamic parameter of battery 18. As used herein, a dynamic parameter includes any parameter of battery 18 which is measured as a function of a signal having an AC or transient component. Examples of dynamic parameters include dynamic resistance, conductance, admittance, impedance or their combinations. In various aspects of the invention, this measurement can be correlated, either alone or in combination with other measurements or inputs received by microprocessor 22, to the condition or status of battery 18. This correlation can be through testing of various batteries and may be through the use of a lookup table or a functional relationship such as a characterization curve. The relationship can also be adjusted based upon battery construction, type, size or other parameters of battery 18. Examples of various testing techniques are described in the following references U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No.

6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 09/654,217, filed Sep. 1, 2000, entitled SYSTEM AND METHOD FOR PROVIDING STEP-DOWN POWER CONVERSION USING INTELLIGENT SWITCH; U.S. Ser. No. 10/174, 110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/280,186, filed Oct. 25, 2002, entitled BATTERY TESTER CONFIGURED TO RECEIVE A REMOVABLE DIGITAL MODULE; and U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/767,945, filed Jan. 29, 2004, entitled ELECTRONIC BATTERY TESTER; U.S. Ser. No. 10/767,945, filed Jan. 29, 2004, entitled ELECTRONIC BATTERY TESTER; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS; which are incorporated herein in their entirety.

In the specific embodiment illustrated in FIG. 1, the forcing function is a function which applies a signal having an AC or transient component to battery 18. The forcing function can be through the application of a load which provides a desired forcing function in which current is drawn from battery 18, or can be through active circuitry in which a current is injected into battery 18. This results in a current labeled $I_F$ in FIG. 1. The total current, $I_T$ through battery 18 is due to both the forcing function current $I_F$ and the current flowing through loads 14, $I_L$. Current sensor 26 is positioned to sense the total current $I_L$. One example battery dynamic parameter, the dynamic conductance (or reciprocally the battery resistance) can be calculated as:

$$\Delta G = V = \Delta I_T / \Delta V 1 \quad \text{EQ. 1}$$

where $\Delta V$ is the change in voltage measured across the battery 18 by voltage sensor 24 and $\Delta I_T$ is the change in total current measured flowing through battery 18 using current sensor 26. Note that Equation 1 uses current and voltage differences. In one embodiment, the change in voltage and change in current are measured over a period of 12.5 seconds and at a rate of 50 msec to thereby provide a total of 20 readings for $\Delta V$ and $\Delta I_T$ every second. The forcing function 28 is provided in order to ensure that the current through battery 18 changes with time. However, in one embodiment, changes in $I_L$ due to loads 14 or the output from alternator 20 can be used alone such that $\Delta I_T = \Delta I_L$ and the forcing function 28 is not required.

In one embodiment, the voltage and current sensors provide synchronized operation, within one microsecond, and are substantially immune to measurement errors due to network propagation delays or signal line inductance. Furthermore, microprocessor 22 can detect a failure of the voltage regulator and alternator 20 if the voltage output exceeds or drops below predetermined threshold levels. This information can be provided to an operator through user interface 32, for example, a "service regulator soon" indication.

A temperature sensor 37 is provided which can be coupled directly to one of the terminals of the battery 18 for measuring battery temperature. The temperature sensor 37 can be used in determining the condition of the battery, as battery condition is a function of temperature and can be used in estimating the amount of power which will be required to start the engine of the vehicle. Any type of temperature sensor can be used, for example, a thermistor, thermocouple, RTD, semiconductor or other temperature sensor.

In one embodiment, current sensor 26 comprises a resistance shunt of 250 μohms and current through the shunt is determined by measuring the voltage drop across the shunt. However, other types of current measurement techniques can also be used such as Hall Effect sensors or through an inductance probe. The change of voltage across the battery and the resultant change in current through the battery is sampled using, for example, one or more analog to digital converters. This information can be correlated to determine the total capacity, such as the total Cold Cranking Amp (CCA) capacity of the battery.

Note that during the measurement cycle, vehicle loads 14 may be applied unexpectedly causing noise to be present in the measurements. One technique which might be considered to reduce the noise is to discard those samples which are outside of a predetermined or adjustable window or are outside of the dynamic range of the analog to digital converter. However, quite unexpectedly it has been found that the accuracy of measurements can be increased by increasing the dynamic range of the analog to digital converters, at the expense of the accuracy of the samples obtained from the converter. By averaging all of the samples, even those which are statistically large or small relative to other samples, the present invention is capable of providing accurate voltage and current measurements even in a noisy environment. By averaging samples, and providing sufficient dynamic range for the analog to digital converter, no samples will be discarded and errors in the measurements will tend to cancel against other errors.

In general, the present invention uses the direct relationship between the dynamic conductance of the battery and the condition of the battery. For example, if a battery drops more than 15% below its rated capacity, microprocessor 22 can provide an output which indicates that the battery 18 should be replaced. Further, the conductance can be used to determine the charge level of the battery. Such a measurement can be augmented to improve accuracy by monitoring the total current flowing into battery 18, or out of battery 18, using current sensor 26. The voltage across the battery 18 can also be used to determine the charge used in the determination of charge level. In general, the state of charge can be determined as a function of various combinations either alone or together of battery state of health, temperature, charge balance (charge going into and out of the battery), charging efficiency and initial conditions such as the battery construction, manufacture, plate configuration or other conditions of the battery. The functional relationship can be determined by characterizing multiple batteries or through the use of artificial intelligence techniques such as neural networks.

Figure 2:
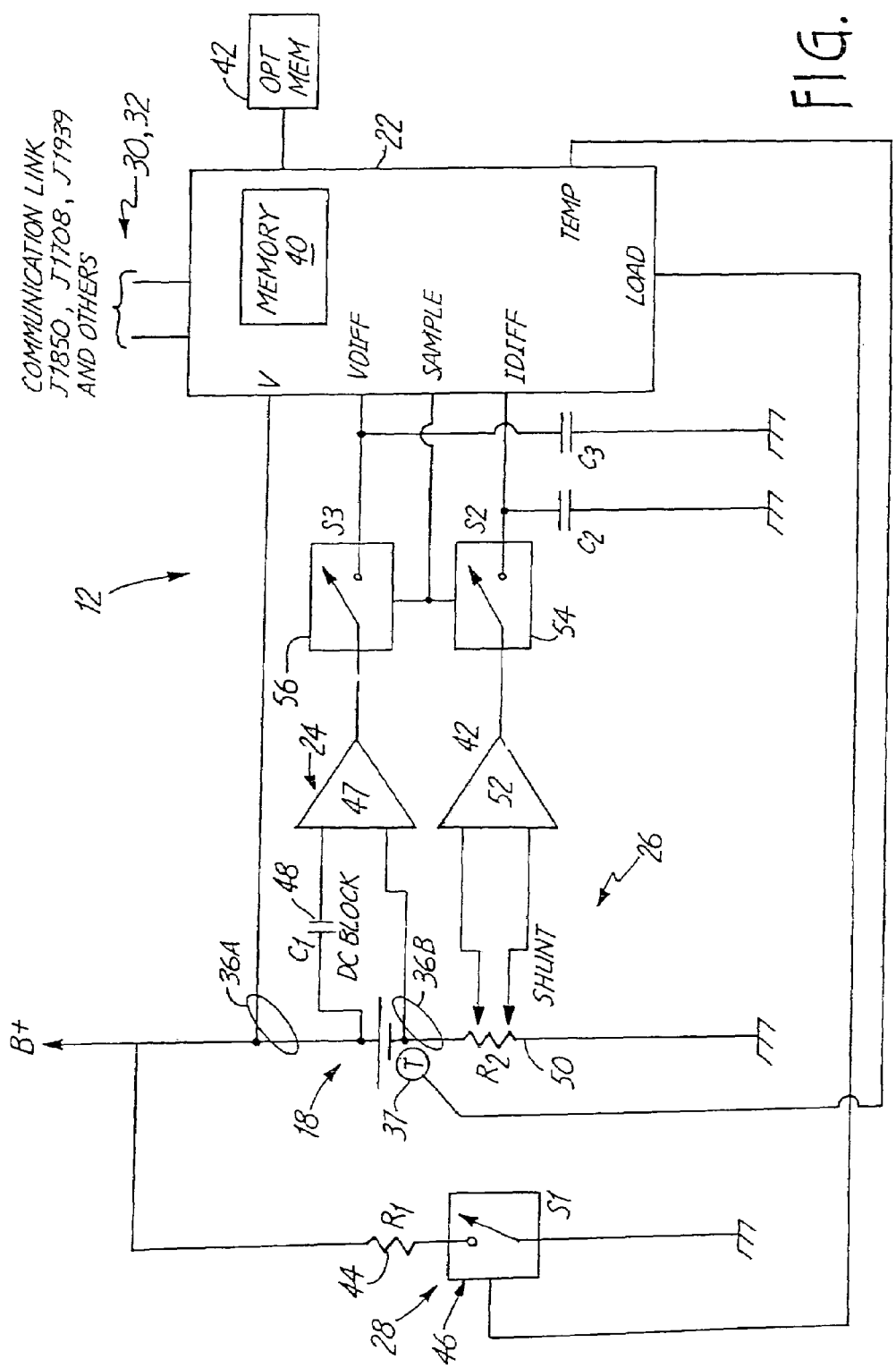
FIG. 2 is a more detailed schematic diagram showing the battery monitor of FIG. 1.

FIG. 2 is a more detailed schematic diagram of battery monitor 12. FIG. 2 shows microprocessor 22 which includes a memory 40. FIG. 2 illustrates I/O 32 with which can be, for specific examples, a communication link in accordance with various standards such as J1850, J1708, J1939, etc. Memory 40 is shown as an internal memory. However, external memory or an optional external memory 42 can also be provided. In general, memory is provided for storing programming functions, ratings, variables, etc. Microprocessor 22 can be a microcontroller or any type of digital circuitry and is not limited specifically to a microprocessor. FIG. 2 illustrates forcing function 28 in greater detail and includes a resistance $R_1$ 44 and a switch $S_1$ 46 controlled by microprocessor 22. Switch 46 can be, for example, a field effect transistor. Voltage sensor 24 is shown as including a differential amplifier 47 coupled to battery 18 through a DC blocking capacitor $C_1$ 48. Shunt 26 is illustrated as a resistance $R_2$ 50 and a differential amplifier 52. Switches $S_2$ 54 and $S_3$ 56 are positioned to selectively couple amplifiers 52 and 47, respectively, to microprocessor 22 and are actuated by a sample control line to provide data samples to microprocessor 22. An analog to digital converter can be an integral part of microprocessor 22 or it can be a separate component to digitize the outputs from amplifiers 47 and 52. Capacitors $C_2$ and $C_3$ provide sample and hold circuits.

Forcing function 28 can be formed by resistance as illustrated in FIG. 2, or by a current sink or through an existing load of the vehicle. Switch $S_1$ 46 can be an FET, or biopolar transistor or can be a mechanical or existing switch in the automotive vehicle. Although shunt 26 is illustrated with a shunt resistance, other types of current sensors such as Hall effect sensors or cable resistance based sensors can be used. Other types of DC blocking techniques can be used to replace capacitancy $C_1$ 48 such as a DC coupled amplifier.

Figure 3:
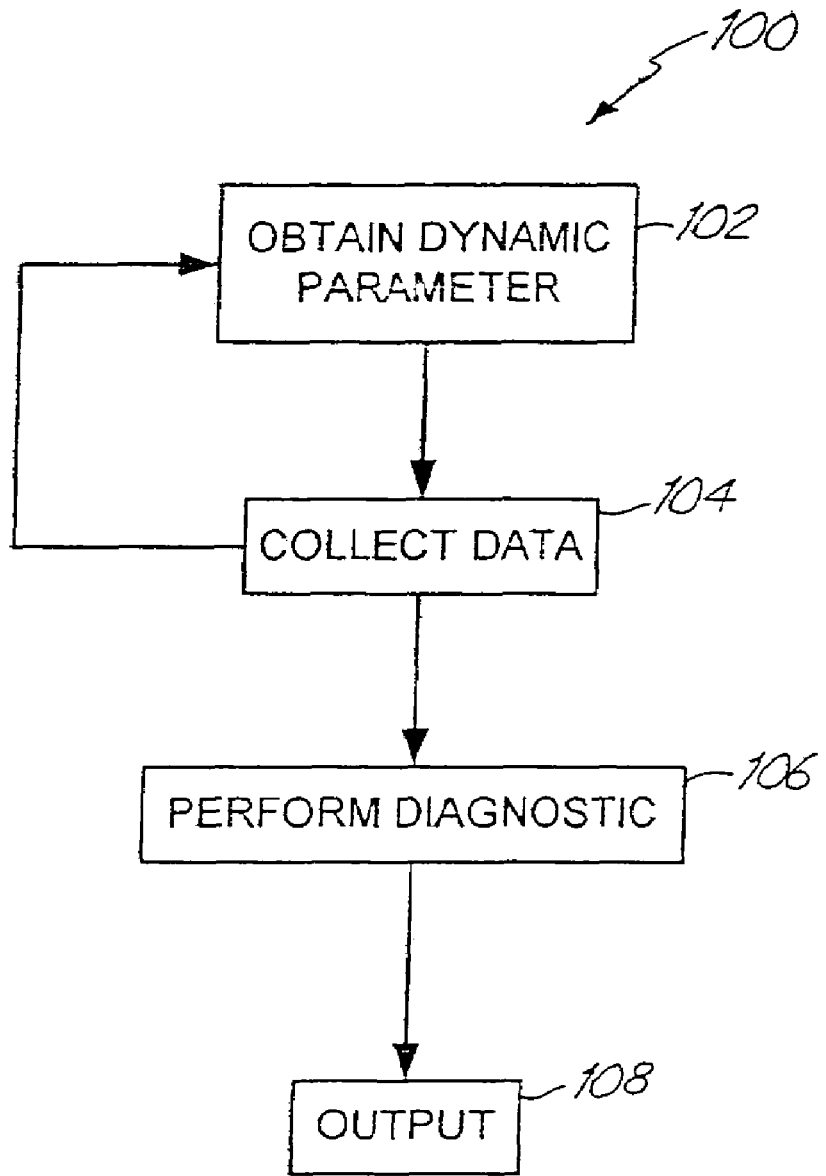
FIG. 3 is a simplified block diagram showing steps in performing diagnostics in accordance with one aspect of the present invention.

FIG. 3 is a simplified block diagram 100 showing diagnostic steps performed by microprocessor 28 in accordance with the invention. At blocks 102 and 104, the dynamic parameter(s) for the battery 18 are obtained and at block 104 data is collected. The type of data collected at block 104 can be any type of data used in determining the condition of the battery. For example, the data can be values used for $\Delta V$ and $\Delta I_T$, information related to the type of battery, etc. This information can be stored in memory 40 for subsequent retrieval by microprocessor 22. The data can be collected over any time period and during any type of engine or battery operation. At block 106, microprocessor 22 performs diagnostics based upon the data stored in memory 40. If a battery fault or impending fault is detected, an output can be provided at block 108 such as providing a "service battery soon" indication on the dash of the vehicle 10.

Various aspects of the invention include the particular diagnostics performed by diagnostic block 106. The diagnostics can be simple diagnostics such as a simple if-then rule in which the collected data is compared to various thresholds to provide the diagnostic output. Absolute values of the data can be used for this comparison or various statistical operations can be performed on the data for use in the comparison. For example, averages or standard deviation of the data can be compared to a threshold. The threshold levels can be determined through testing of the vehicle and entered into memory 40 during manufacture. Preferably, when battery 18 is replaced, the thresholds are updated accordingly.

In more advanced embodiments of the diagnostic block 106, microprocessor 22 can perform diagnostics using fuzzy logic, neural networks or artificial intelligence techniques. Neural networks can advantageously be used as they do not require that the battery, alternator and vehicle loads be modeled. Instead, neural networks are capable of learning what "normal" data collected at step 104 should be, and can provide an indication when a pattern of the data is drifting outside of normal operation. Further, the neural network can be "trained" to recognize potential sources of the failure and provide an expected time until the system completely fails. These diagnostic techniques can be selected and implemented such that the operator is warned of an impending failure, prior to the complete failure of the battery 18 or alternator 20.

Figure 4:
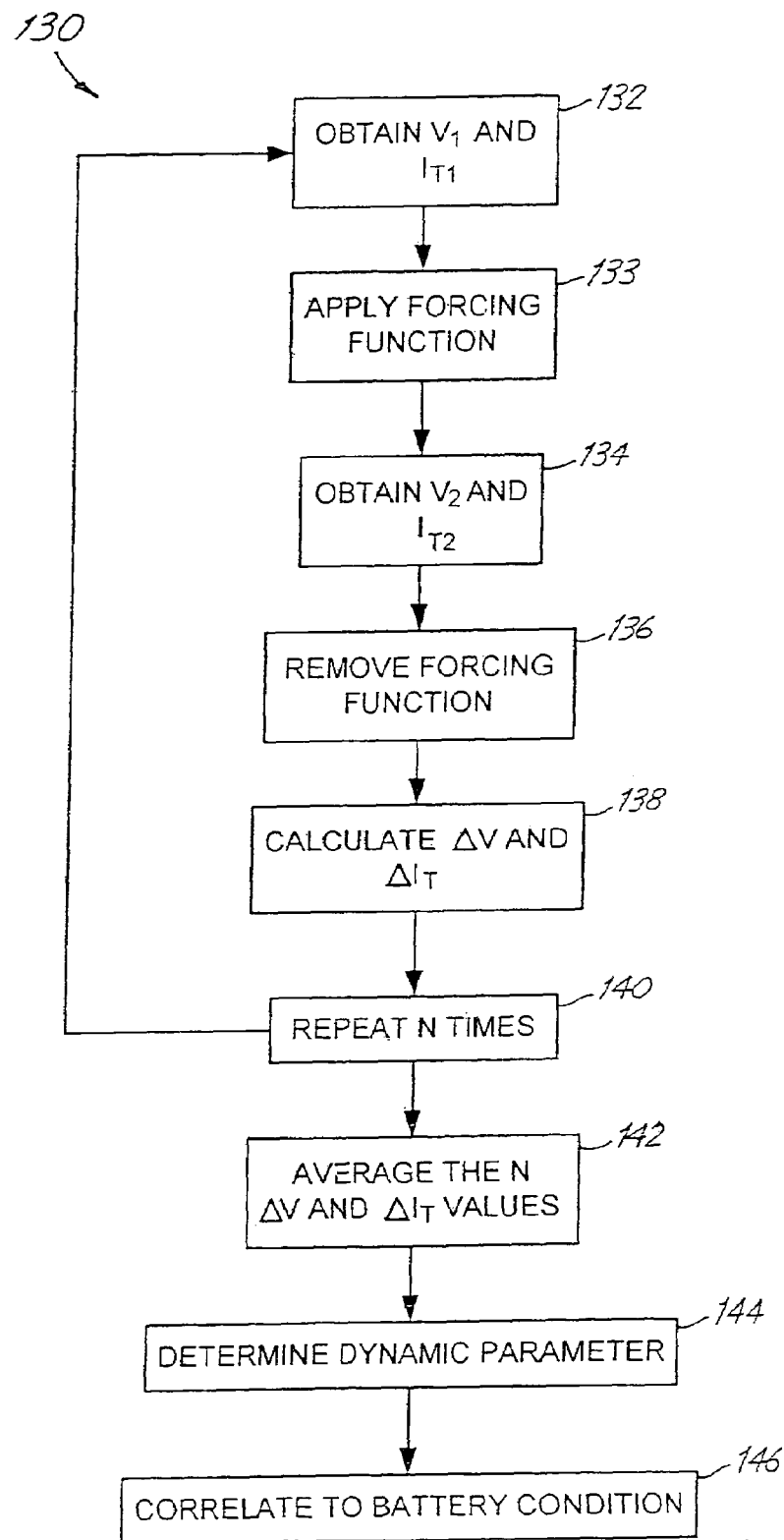
FIG. 4 is a simplified block diagram showing steps in collecting data for use with the present invention.

FIG. 4 is a block diagram 130 showing example steps in accordance with data collection and calculation of a dynamic parameter in accordance with the present invention. Of course, as should be pointed out with respect to all of the flow charts set forth herein, those skilled in the art will recognize that the particular functions of the blocks and the order in which the blocks are executed can be easily rearranged and the invention is not limited to the specific embodiments set forth herein.

In block diagram 130, at block 132 microprocessor 22 obtains an initial voltage $V_1$ across battery 18 using voltage sensor 24 and an initial current $I_{T1}$ through battery 18 using current sensor 26. Next, the forcing function 28 is applied to battery 18 at step 133. At block 134, microprocessor 22 obtains values $V_2$ and $I_{T2}$ with the forcing function applied, and at step 136 the forcing function is removed. Values for $\Delta V$ and $\Delta I_T$ are calculated at step 138. In one example embodiment, the forcing function is applied for a duration of 100 μSec 20 times every second. N values are obtained at block 140. In one example, N is equal to 256. At block 142, the average of $\Delta V$ and $I_{T2}$ for the N samples is calculated and a dynamic parameter for the batter 18 is determined at block 144. This dynamic parameter can be correlated to a condition of the battery at block 146 and displayed on user I/O 32, output through I/O 30 or used to control alternator 20 through alternator control 23.

In one aspect of the invention, the battery monitor performs a state of charge measurement, in real time and regardless of battery polarization, and automatically corrects for the state of health of the battery and the battery temperature. In general, state of health can be determined as a function of the battery conductance and the open circuit voltage across battery 18. For example, the state of health can be determined as:

$$SOH = k_1(G/\text{RATING}) * f(V_{OC}) - k_2 \qquad \text{EQ. 2}$$

where $k_1$ and $k_2$ are constants which are related to the type of battery, G is the measured conductance of the battery, rating is a rating for the battery and $f(V_{OC})$ is a relationship between the state of charge and the open circuit voltage of the battery as set forth in the aforementioned Champlin and Midtronics, Inc. patents. The state of health will range between 0 and 100%. Using the state of health determined by Equation 2, the state of charge (from 0 to 100%) can be determined in accordance with Equation 3:

$$SOC_{t2} = 100 * \frac{\left[\int_{t_1}^{t_2} i\,dt \int_{t_1}^{t_2} e(T)\,dt \int_{t_1}^{t_2} e(i)\,dt\right]}{(SOH)(AMP-HOURCAPACITY)} + SOC_{t1} \qquad \text{EQ. 3}$$

where $t_1$ is the time at which the state of charge is known (i.e., from the period of overcharge, for example), $t_2$ is the present time, i is the current (amps) in or out of the battery at time t, T is the battery temperature, e(T) is the charge acceptance efficiency at temperature T, and e(i) is the charge acceptance efficiency at current i. Of course, Equations 2 and 3 are simply examples of state of health and state of charge measurements and other techniques can be used in accordance with the invention.

Figure 5:
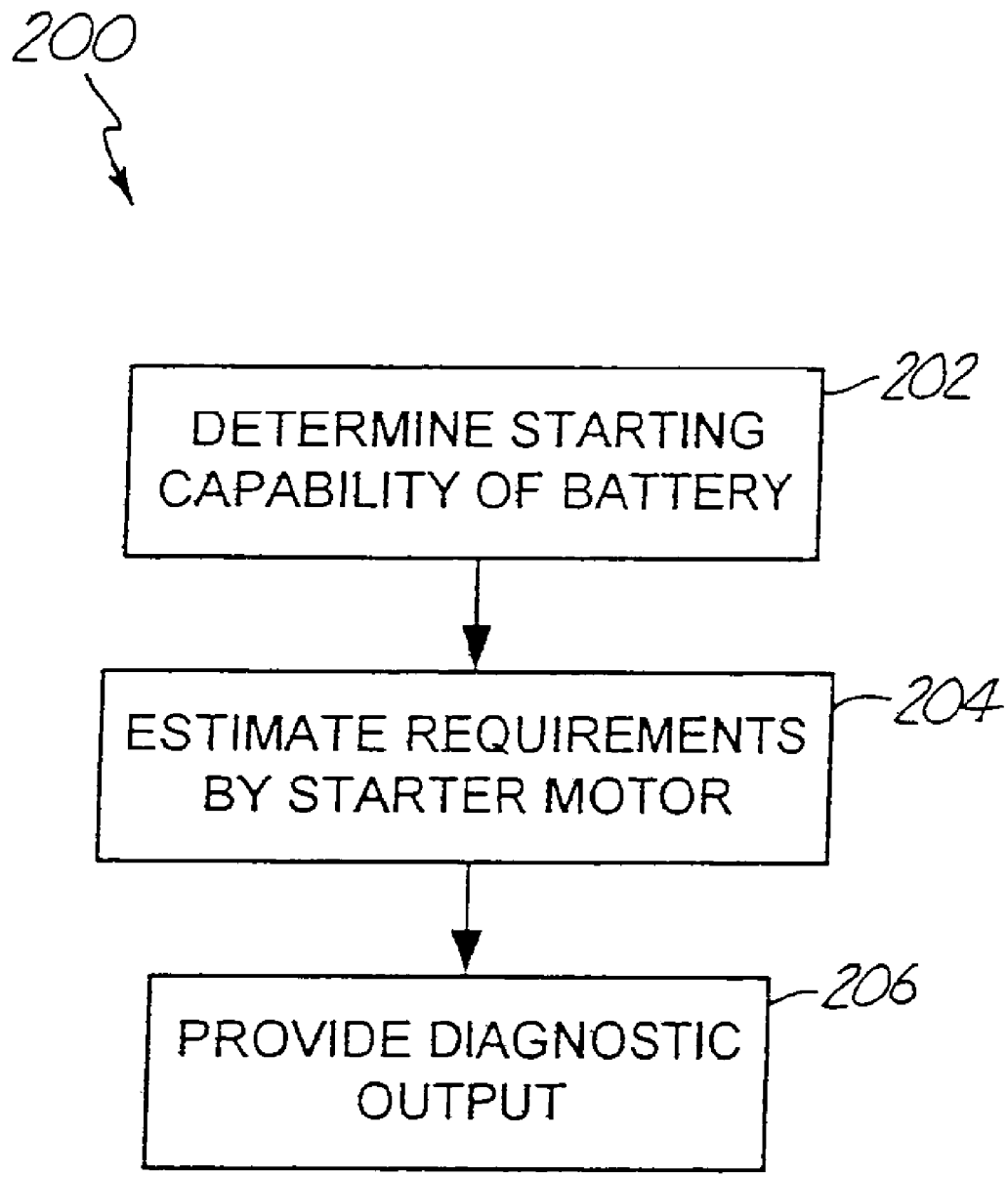
FIG. 5 is a simplified block diagram which illustrates performing diagnostics on a starter motor of the vehicle of FIG. 1.

Using the battery state of charge and the battery state of health, battery monitor 12 can predict the starting capabilities of a starter motor of vehicle 10. For example, by comparing the amount of current measured by current sensor 26 which has been previously been required to start the engine of vehicle 10 for a particular temperature, microprocessor 22 can determine if the current state of charge of the battery for the current state of health at the current temperature will be sufficient to provide enough current to start the engine. The performance and any degradation in the starter motor can also be taken into account by microprocessor 22. For example, if the amount of current required to start the engine has been increasing with time, microprocessor 22 can extrapolate and predict what amount of current will be required to start the engine in the future. FIG. 5 is a simplified block diagram 200 which illustrates steps performed by a microprocessor 22 in diagnosing the starting capability of battery 18. At block 202, microprocessor 22 determines the starting capability of battery 18. For example, the starting capability can be an estimation or measurement of the amount of current which battery 18 can supply over a short duration. At block 204, microprocessor 22 estimates the starting requirements of the starting motor of the engine of vehicle 10. For example, the past requirements of the starter motor can be recalled from memory 40 and any trend can be used to predict what will be required for starting the engine. Other inputs can also be used in this determination such as the current temperature. At block 206, a starter diagnostic output is provided. For example, if it appears that the battery will have difficulty in operating the starter motor for a sufficient duration to start the motor of the vehicle, vehicle loads 14 can be selectively switched off by microprocessor 22 through I/O 30. Additionally, a warning can be provided to an operator through user I/O 32 of an impending problem, prior to its actual occurrence, such that the battery 18 can be replaced.

In another aspect of the invention, microprocessor 22 can be adapt or alter the performance of the engine and/or loads 14 based upon a number of different parameters in order to provide optimal charging to battery 18. For example, microprocessor 22 can interface to a data bus of a microprocessor of the vehicle 10 through I/O 30 to control engine operation. Alternatively, microprocessor 22 can be the same microprocessor used to control vehicle operation. The microprocessor 22 can adjust the idle speed of the engine, shift points of the transmission and the load placed on the electrical system by some of the loads 14 to increase or decrease the rate of battery charging based upon the expected driving patterns of an operator. For example, if the microprocessor has observed that the vehicle is normally operated for a short duration, the microprocessor 22 can increase the idle speed of the engine and attempt to reduce loads placed on battery 18 to increase the charging rate of battery 18. Further, microprocessor 22 can alter the shift points of the transmission to cause the engine to operate at a high (or lower) speed than normal. The prediction of engine operation can also be based upon time of day and the day of the week such that repeated driving patterns can be accounted for, for example, commuting to work. Further, in vehicles where it is possible to recognize the operator of the vehicle, such as through the seat position memory in a power seat of the vehicle, microprocessor 22 can alter the charging pattern based upon the driving characteristics of a specific driver.

Figure 6:
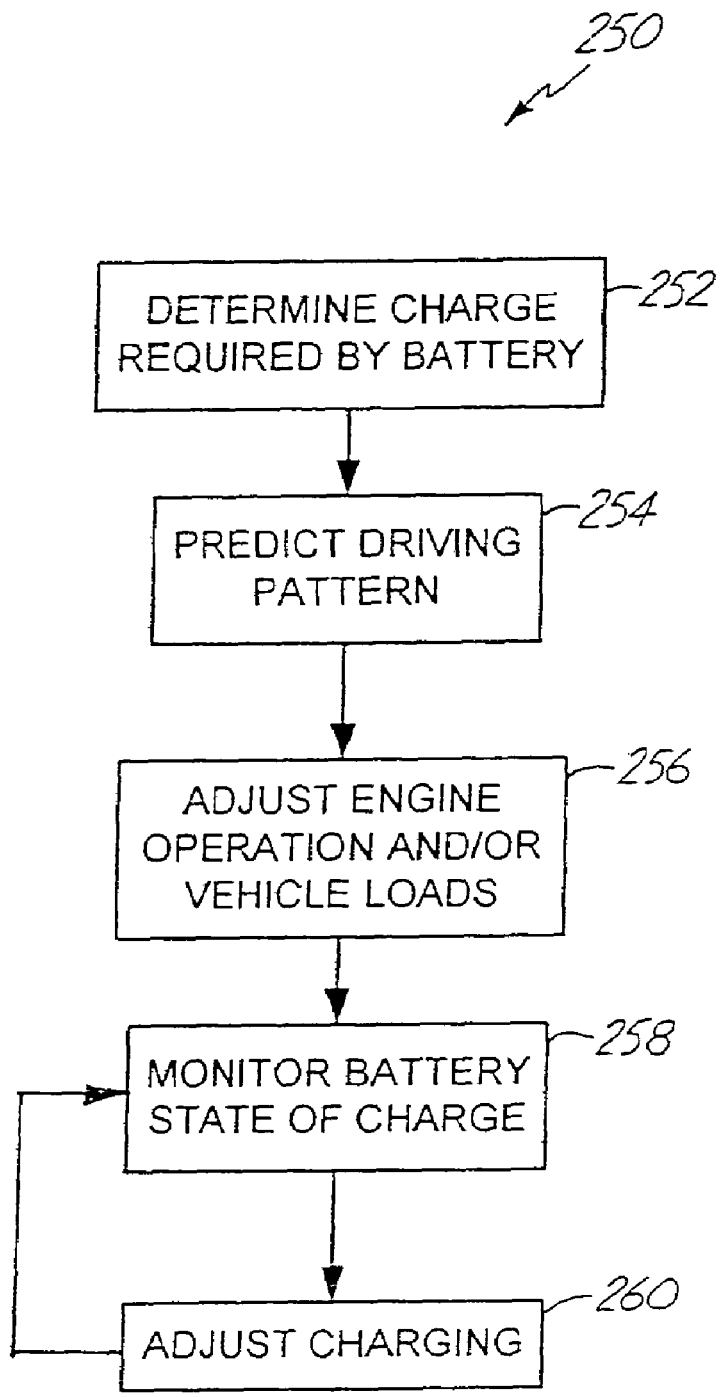
FIG. 6 is a simplified block diagram showing steps related to adjusting the charging profile for charging the battery of the vehicle of FIG. 1.

FIG. 6 is a simplified block diagram flowchart 250 showing steps performed by microprocessor 22 in adjusting engine speed or loads to control the charge in battery 18. Block 252, microprocessor 22 determines the charge required by battery 18 to become fully charged, this determination can be based upon a measurement of the current charge level of battery and a determination of the maximum amount of charge that battery 18 can hold, for example, as a function of the state of health of battery 18. At block 254, microprocessor 22 predicts the expected driving pattern for the upcoming engine use. At block 256, microprocessor 22 adjusts the engine operation and/or vehicle loads 14 in order to optimize the charging of the battery 18 based upon the charge required as determined at step 252 and the driving pattern predicted at step 254. During engine operation, microprocessor 22 continues to monitor the battery state of charge at block 258 and adjusts the charging accordingly at block 260. Once battery 18 has been fully charged, the microprocessor 22 can reduce the charging rate as appropriate.

If the drive cycle is, or has tendency to be, insufficient to charge the battery 18, microprocessor 22 can provide an output to an operator through user I/O 32 to indicate that either the vehicle must be driven for an extended period of time or an alternative charging method be used to charge battery 18. An indication can also be provided as to a prediction regarding how many further such drive cycles can be supported by the battery 18 before it will have insufficient remaining charge to start the vehicle.

Figure 7:
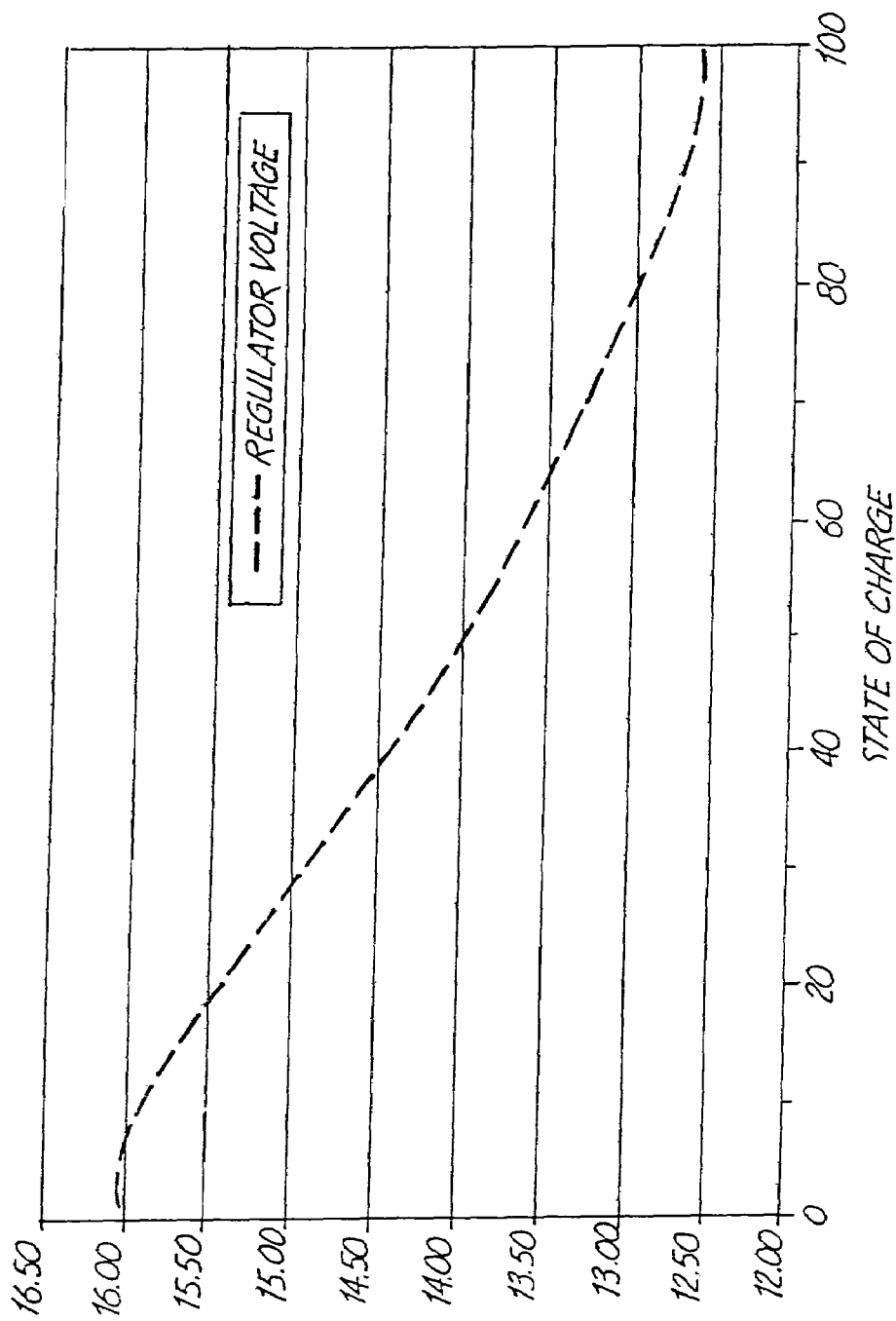
FIG. 7 is a graph which illustrates one sample curve of regulator voltage output versus state of charge for the battery of FIG. 1.

As discussed above, in one aspect of the present invention, the output from the alternator 20 is adjusted based upon the state of charge and/or the state of health determination(s). FIG. 7 is a graph showing the regulator voltage output from alternator 20 as a function of the state of charge of battery 18.

As illustrated in FIG. 7, microprocessor 22 reduces the voltage output from alternator 20 as the state of charge of battery 18 increases to 100% charge. The particular profile can be adjusted to a specific battery, alternator and/or engine configuration or to the driving characteristics of an operator. Such a system can significantly reduce or eliminate overcharging of battery 10 and the generation of excessive heat. Further, such a technique can be used to reduce or eliminate the undercharging of battery 10. Additionally, by adjusting the voltage based upon the state of charge, battery 18 and system component life will increase. For example, vehicle loads 14 will be exposed to over voltages for a reduced amount of time. This also allows the various systems components to be optimized for particular charging requirements or voltage levels. In general, the output of the alternator 20 can be reduced and the battery capacity required for a particular vehicle can be reduced because battery charge will be more efficiently maintained. This can reduce overall vehicle weight and improve vehicle mileage. Further still, IR (current-resistance) type losses in the electrical system and overcharging will be reduced thereby reducing the load on the vehicle engine and improving efficiency of the vehicle. In general, this technique will improve vehicle reliability by reducing heat due to excessive IR losses, increasing battery life, providing early detection of impending battery failure and insuring proper vehicle operation even with after market batteries which are used to replace the original battery.

If such a system is implemented when the vehicle is originally manufactured, monitor 12 allows battery management over the entire life of the vehicle. This can be both during assembly and delivery of the vehicle as well as during the lifespan of actual vehicle operation. Additionally, one aspect includes a storage battery 18 with rating information carried in a computer storage device such as a digital memory within a housing of the battery. This data can be communicated to monitor 12 through I/O 30. In one aspect, the electrical connections to the battery are also used as a data communication bus such that monitor 12 can communicate with the storage device in battery 18. The storage device can also be used to store the history, such as the charging and usage history, of battery 18.

Battery monitor 12 can monitor and diagnose operation of alternator 20. For example, a typical alternator provides a multiphase output. By monitoring the data points collected and stored in memory 40, microprocessor 22 can observe the loss of one or more phases in the alternator's output. Similarly, the failure of a rectifying diode in alternator 20 can be detected by microprocessor 22 by observing an asymmetrical ripple pattern. Microprocessor 22 can provide an output to an operator through user I/O 32 such as a "service alternator soon" output. This information can also be communicated to the vehicle microprocessor through I/O 30.

I/O 30 is shown in schematic form and can be any type of input or output and represents, in some embodiments, multiple input(s) and output(s). Various examples of inputs and outputs include a connection to a databus of the vehicle, a connection to a databus adapted to couple to a diagnostic device such as that provided in service equipment, a connection to a remote vehicle monitoring system, such as one that is capable of coupling through a cellular phone connection of the vehicle. In such an embodiment, the vehicle is capable of recording and reporting information to a remote service such as an emergency assistance service or a service provided to monitor the operation of the vehicle and suggest that maintenance be provided. Various types of inputs and outputs can be provided through direct connections or through non-physical connections such as radio frequency or infrared communication techniques. The particular form of the data and standard used for the inputs and outputs can be selected as proprietary or industry standards. Microprocessor 22 can also be capable of providing advanced reporting and control functions through the use of standardized interfaces such as are available through HTML, XML, or various known or proposed alternatives. In such an embodiment, information collected by microprocessor 22 can be viewed through a "web page" interface provided by a browser. Such an embodiment is advantageous because it can provide a user input/output such as user I/O 32 in a standardized form such that it can be viewed or controlled through many types of standardized devices. In such an embodiment, information can be reported to, or the monitor 12 can be controlled, from a remote location. Additionally, if the vehicle 10 includes a browser type interface which may become commonly available in vehicles, the microprocessor 22 can be controlled and communicate through the vehicle's browser. In one aspect, vehicle monitor includes an IP (Internet Protocol) address such that it is capable of communicating in accordance with the Internet Protocol. When coupled to, for example, a cellular telephone connection of the vehicle, the battery monitor 12 is capable of being monitored and controlled from a remote location coupled through the Internet. However, as mentioned above, such an interface also provides a simple technique for interfacing the monitor 12 with a local computer in the vehicle and displaying information from the monitor 12 for use or control by an operator.

Through the use of the data collected by microprocessor 22 and memory 40, microprocessor 22 is also capable of detecting the imminent failure of the starter motor of the vehicle. For example, by monitoring the voltage drop through the system during starting, microprocessor 22 can determine the average time to start the engine and the average and peak currents required during starting. Changes in these, or other, measurement values can indicate a degrading starter motor. Upon detection of an impending failure, a "service starter motor soon" indication can be provided to an operator through user interface 32.

Microprocessor 22 can provide an indication that the battery 18 has insufficient capacity or substandard performance and alert an operator accordingly. For example, upon power up, such as that which occurs when battery 18 is replaced, microprocessor 22 can measure the capacity of the battery 18 and provide an indication to the operator if the capacity is less than a threshold level determined by the vehicle manufacturer and stored in the memory of the vehicle computer system.

Microprocessor 22 can generate an audit code (or a warranty code) in response to the various tests and data collected. Such codes are described in U.S. Pat. No. 6,051,976, issued Apr. 18, 2000, entitled METHOD AND APPARATUS FOR AUDITING A BATTERY TEST which is assigned to the present assignee and is incorporated herein by reference. In such an embodiment, microprocessor 22 encodes data collected or obtained during its operation. For example, raw data related to a battery test can be obtained and/or the ultimate result of the battery test and subsequently encoded by microprocessor 22. The encoding can be a simple transposition cipher in which the locations and values of various bytes of information are rearranged. Such a code can be designed to prevent falsification of data which can occur where unscrupulous individuals are attempting to submit a falsified warranty claim for a failed component to a manufacturer. This coding technique allows the manufacturer to verify information when a warranty is submitted. Additionally, the information can be used to track operator error and assist in identification and isolation of component failure in order to redesign the components and reduce such failures.

In another aspect, microprocessor 22 is capable of automatically calibrating the measurements obtained from voltage sensor 24 and current sensor 26. Using this aspect of the invention, microprocessor 22 can perform automatic or periodic calibrations to maintain accuracy over the lifespan of the vehicle. Automatic calibration can be provided by selectively switching in calibrated elements having known temperature and time drift characteristics, and using the measured data to correct for instrumentation gains and offsets. For example, a known resistance or voltage source can be selectively coupled to amplifiers 47 or 52. Any offset values from these known values can be stored in memory 40 and used by microprocessor 22 to compensate for errors in measurements.

With the present invention, any polarization of the battery 18 such as that which can result from charging or starting operations, does not produce errors in the measurements performed by microprocessor 22. Specifically, any such errors are eliminated by use of a real-time state of charge algorithm that is independent of the real time battery terminal voltage.

When the engine of vehicle 10 is not operating, microprocessor 22 can enter a sleep mode to reduce current draw and the resultant discharge of battery 18. If desired, microprocessor 22 can periodically "wake up" to perform tests or monitor some aspect of the electrical system of vehicle 10.

A loose or corroded connection to battery 18 can be detected by microprocessor 22 by observing a sudden increase in the resistance across battery 18. An error can be provided to an operator through user interface 32 to alert the operator of the degraded connection.

Microprocessor 22 can also perform diagnostics on the electrical system of vehicle 12 when the engine is not operating. For example, microprocessor 22 can monitor the current being drawn by loads 14 when the engine is not running using current sensor 26. For example, microprocessor 22 can compare the rate of current draw, over a selectable sample period with a threshold stored in memory 40. If the measured rate exceeds the threshold, there may be a fault in the electrical system of the vehicle. Similarly, a small but constant current drain can also indicate a fault which could lead to the discharge of battery 18. Microprocessor 22 can provide an indication to the user through user interface 32 that excessive current draw has occurred while the engine is off. Such current draw can lead to rapid discharge of battery 18 and prevent starting.

Current sensor 26 can also be used by microprocessor 22 to monitor the current flowing into and out of battery 18. The summation of this current, taken over a time period (i.e., integration) can provide an indication that the battery is not receiving sufficient charge, or can provide an indication of the total charge received by battery 18. This information can be displayed to an operator through user I/O 32. Additionally, the information can be provided on I/O 30. If the information indicates that the battery 18 is not receiving sufficient charge, steps can be taken as discussed above, to increase the charging rate of battery 18.

In one embodiment, microprocessor 22 stores information in memory 40 related to the model number, and/or serial number, capacity or other information related to battery 18. In such an embodiment, battery monitor 12 can be a physical part of battery 18 such that battery specific information can be programmed into memory during manufacture. The battery monitor 12 can provide an output to an operator through a display or other type of output device which is physically located on the battery 18. Additionally, the display or user I/O 32 can be located within the vehicle. Input/output 30 can be configured to couple to the databus of the vehicle. For example, the battery 18 can include a data plug adapted to plug into the databus of the vehicle such that monitor 12 can exchange information through the databus. Microprocessor 22 can then report this information to the databus of the vehicle using input/output 30. This allows the microprocessor of the vehicle the ability to perform advanced diagnostics and monitoring as the specific battery type is known.

The present invention can also be used to provide a predictive assessment of battery operation and/or condition. Such a predictive assessment is an indication of future battery performance or battery performance based upon changes to the operating environment of the battery. With this aspect of the present invention, the battery tester receives input about the environment or particular application of the vehicle and this information is used to make a predictive assessment regarding the ability of the battery to operate in those conditions. Thus, normally unanticipated or unpredictable conditions can be estimated and assessed by the battery tester measurements along with the history of the battery.

For example, weather forecast information can be used as part of the battery test operation. Although the battery may be of sufficiently good condition to operate in current conditions, the weather forecast may indicate that a temperature drop will occur in the future. This forecast information can be used to downgrade the assessment of the battery and provide an indication that the battery may fail if used in the future under the forecast conditions. Similarly, if a vehicle will be driven to a location in which the weather conditions are different, the geographic information, and/or weather forecast information for the geographic location, can be used in the assessment of the battery. For example, if a vehicle will be driven into a cold region, if information regarding the region is provided to the battery tester, the battery tester can provide an indication that the battery will or may fail at the new location. For example, information could be provided to the operator of a truck driving from Arizona to Minnesota and advise the truck driver that at the destination weather forecast information, along with the battery test, indicates that the battery will be insufficient for the expected use. The weather forecast information and/or geographic information can be provided using any technique including manual inputs, inputs via a databus of the vehicle, wireless or other inputs to the vehicle or directly to the battery tester, and may include the use of a Global Positioning System.

This predictive assessment can also be used to change the battery condition output based upon new or differing loads which are applied to the electrical system of the vehicle. For example, if a new device is coupled to the electrical system and requires additional power, the battery condition information can be updated to indicate that the battery may not be sufficient for this new load. The additional load can be determined by measuring operation of the electrical system, for example current draw, or can be determined using a manual or automatic input to the battery tester. The power requirements of the new load can be determined either by measurements by the battery tester or can be determined using data stored in a look-up table in a memory of the tester. The predictive assessment can be based upon any of the battery tester measurements discussed herein including state-of-charge determination. Predictions related to voltages of the battery can also be used in the determination.

Additionally, the predictive assessment can be used to change the test criteria based upon changes in the loads currently applied to the electrical system. For example, as a particular component ages or starts to fail, for example a starter motor or alternator, the predictive assessment of the battery condition can be modified accordingly. For example, a predictive assessment can be provided which indicates when the battery and a starter motor will not be able to adequately serve each other. A similar prediction can provided for the alternator. As the alternator fails, it may not be able to adequately charge the battery and the predictive assessment can provide an indication of issues related to the battery, as well as issues related to vehicle loads served by the alternator and the battery.

The predictive assessment can also be used to provide an indication of the energy available for additional loads. For example, the battery tester can provide an output which is an estimate of the excess energy available for supply to additional loads which are not currently connected to the system. For example, the battery tester output can provide an indication of the excess power capable for powering an additional load such as a TV, navigation system, etc. If not enough power is available, the new load should not be coupled to the electrical system, or the components of the electrical system such as the battery or alternator should be repaired or updated. Such a configuration is particularly useful for certain types of applications such as recreational vehicles in which large loads may be applied to the electrical system, or hybrid vehicles which may provide a 110 volt output suitable for providing power to common consumer goods. From an operator perspective, a technical output such as "100% state-of-charge" or "25 amp hours" may not be as meaningful as an indication that shows what types of additional loads could be coupled to the system, i.e., "energy available for: vacuum, heater, fan". Once the new load is coupled to the electrical system, the battery tester can reassess battery and vehicle condition.

Although the present invention has been described with reference to preferred embodiments, workers skilled in the art will recognize that changes may be made in form and detail without departing from the spirit and scope of the invention. For example, the circuitry and circuit configuration is provided as simply one embodiment and those skilled in the art will recognize that other configurations can be provided. The particular connections to the battery can be through Kelvin connections which include a "split" Kelvin connection in which the forcing function connection(s) are/is spaced apart from the battery such as that described and illustrated in U.S.

Pat. No. 6,163,156, issued Dec. 19, 2000 and entitled ELECTRICAL CONNECTION FOR ELECTRONIC BATTERY TESTER which is incorporated herein by reference in its entirety. In a further example of the present invention, alternator 20 can comprise an electronic battery charger such as those used to charge automotive vehicles when the vehicle is stationary or to charge stand by batteries such as those used in remote systems such as cellular sites. In such an embodiment, control line 23 is used to adjust the charger of battery 18 using the techniques set forth herein. In such an embodiment, element 10 shown in FIG. 1 illustrates a standby power supply for equipment.

What is claimed is:

1. An apparatus for testing an electrical system of a vehicle, comprising:
    test circuitry to test a current condition of the electrical system of the vehicle at a current time;
    an environment input configured to receive information at the current time related to a new geographical location in which the vehicle is to be operated at a future time; and
    a predictive assessment output at the current time which is a function of the current condition of the electrical system and the environment input and is indicative of a prediction of performance of the electrical system in the new geographical location in which the vehicle will operate at the future time.

2. The apparatus of claim 1 wherein the environment input is related to a weather forecast which is indicative of future weather in which the vehicle will operate.

3. The apparatus of claim 1 wherein the environment input is related to electrical loads which will be applied to a battery of the electrical system.

4. The apparatus of claim 1 wherein the environment input is related to changes in electrical loads applied to a battery of the electrical system.

5. The apparatus of claim 1 wherein the predictive assessment output is related to available energy for operating electrical loads of the vehicle.

6. The apparatus of claim 1 wherein the electrical system includes a battery and the test circuitry is configured to perform a battery test.

7. The apparatus of claim 6 wherein the battery test is related to a measurement of a dynamic parameter of the battery.

8. The apparatus of claim 6 wherein the test circuitry includes a four point Kelvin connection configured to couple to the battery.

9. The apparatus of claim 6 wherein the test circuitry includes a current sensor configured to measure current flow through an electrical conductor coupled to the battery.

10. The apparatus of claim 1 wherein the electrical system includes a battery charger configured to charge a battery of the electrical system, and wherein the battery charger is responsive to the predictive output.

11. The apparatus of claim 10 wherein the test circuitry is configured to measure a state of charge of the battery and the battery charger is responsive to a measured state of charge.

12. The apparatus of claim 1 wherein the predictive assessment output is indicative of a likelihood that an engine of the vehicle will start.

13. The apparatus of claim 1 wherein the environment input is further configured to receive information related to a particular application of the vehicle.

14. The apparatus of claim 1 wherein the environment input comprises a manual input.

15. The apparatus of claim 1 wherein the environment input comprises an input from a databus.

16. The apparatus of claim 1 wherein the environment input includes information from a global positioning system.

17. The apparatus of claim 3 wherein the predictive assessment output indicates that a battery of the electrical system is insufficient for powering the load with power supplied by the battery.

18. The apparatus of claim 3 wherein the environment input comprises a current measurement to determine power requirement of a new load applied to the battery.

19. The apparatus of claim 1 wherein the test circuitry is further configured to perform a battery test in accordance with a test criteria and wherein the test criteria is a function of the predictive assessment output.

20. The apparatus of claim 1 wherein the predictive assessment output is a function of an age of a component of the electrical system.

21. The apparatus of claim 1 wherein the predictive assessment output is indicative of excess energy available from the electrical system for use in powering loads coupled to the electrical system.

22. A method of testing an electrical system of a vehicle, comprising:
    testing a current condition of the electrical system of the vehicle at a current time;
    receiving a environment input at the current time related to the new geographical location in which the vehicle is to be operated at a future time; and
    providing a predictive assessment output at the current time which is a function of the testing and the received environment input, wherein the predictive assessment output is indicative of a prediction of performance of the electrical system in a new geographical location in which the vehicle will operate at the future time.

23. The method of claim 22 wherein the environment input is related to weather forecast which is indicative of future weather in which the vehicle will operate.

24. The method of claim 22 wherein the environment input is related to loads which will be applied to a battery of the electrical system.

25. The method of claim 22 wherein the environment input is related to changes in loads applied to a battery of the electrical system.

26. The method of claim 22 wherein the predictive assessment output is related to available energy for operating loads of the vehicle.

27. The method of claim 22 wherein the electrical system includes a battery and the testing includes performing a battery test.

28. The method of claim 27 wherein the battery testing includes measuring a dynamic parameter of the battery.

29. The method of claim 27 wherein the testing includes coupling a four point Kelvin connection to the battery.

30. The method of claim 27 wherein the testing includes measuring current flow though an electrical conductor coupled to the battery.

31. The method of claim 22 including controlling a battery charger configured to charge a battery of the electrical system in response to the predictive assessment output.

32. The method of claim 31 wherein the testing includes measuring a state of charge of the battery and the battery charger is responsive to a measured state of charge.

33. The method of claim 22 wherein the predictive assessment output is indicative of a likelihood that an engine of the vehicle will start.

34. The method of claim 22 wherein the environment input is further configured to receive information related to a particular application of the vehicle.

35. The method of claim 22 wherein the environment input comprises a manual input.

36. The method of claim 22 wherein the environment input comprises an input from a databus.

37. The method of claim 22 wherein the environment input includes information from a global positioning system.

38. The method of claim 24 wherein the predictive assessment output indicates that a battery of the electrical system is insufficient for powering a load coupled to the battery.

39. The method of claim 24 wherein the environment input comprises a current measurement to determine power requirement of a new load coupled to the battery.

40. The method of claim 22 wherein the test circuitry is further configured to perform a battery test and wherein the test criteria is a function of the predictive assessment output.

41. The method of claim 22 wherein the predictive assessment output is a function of an age of a component of the electrical system.

42. The method of claim 22 wherein the predictive assessment output is indicative of excess energy available from the electrical system for use in powering loads coupled to the electrical system.

* * * * *